(12) United States Patent
Xu et al.

(10) Patent No.: US 12,035,596 B2
(45) Date of Patent: Jul. 9, 2024

(54) OLED DISPLAY WITH ALL ORGANIC THIN FILM LAYERS PATTERNED

(71) Applicant: Universal Display Corporation, Ewing, NJ (US)

(72) Inventors: Xin Xu, Plainsboro, NJ (US); Gregory McGraw, Yardley, PA (US); William E. Quinn, Whitehouse Station, NJ (US); Gregg Kottas, Ewing, NJ (US); Jason Paynter, Bristol, PA (US); Julia J. Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 18/079,976

(22) Filed: Dec. 13, 2022

(65) Prior Publication Data

US 2023/0112871 A1   Apr. 13, 2023

Related U.S. Application Data

(63) Continuation of application No. 16/431,813, filed on Jun. 5, 2019, now Pat. No. 11,552,159.

(Continued)

(51) Int. Cl.
    *H10K 59/12*   (2023.01)
    *H10K 59/131*  (2023.01)
(Continued)

(52) U.S. Cl.
    CPC ......... *H10K 59/1315* (2023.02); *H10K 71/00* (2023.02); *H10K 71/135* (2023.02);
(Continued)

(58) Field of Classification Search
    CPC .... H10K 71/16; H10K 71/166; H10K 59/123; H10K 59/122; H10K 59/38;
(Continued)

(56) References Cited

U.S. PATENT DOCUMENTS

| 4,769,292 A | 9/1988 | Tang |
| 5,247,190 A | 9/1993 | Friend |

(Continued)

FOREIGN PATENT DOCUMENTS

| WO | 2008057394 A1 | 5/2008 |
| WO | 2010011390 A2 | 1/2010 |

OTHER PUBLICATIONS

Baldo et al. "Highly efficient phosphorescent emission from organic electroluminescent devices", Nature, vol. 395, pp. 151-154, 1998.

(Continued)

*Primary Examiner* — Galina G Yushina
(74) *Attorney, Agent, or Firm* — Butzel Long

(57) ABSTRACT

Embodiments of the disclosed subject matter provide a device having a substrate, and a plurality of unit areas of an organic light emitting diode (OLED) display disposed on the substrate. The unit areas may be repeating, area-filling subdivisions on the substrate that each have an anode and a cathode. The organic film may be disposed over portions of the device other than the unit areas. The device may include at least one pixel having a plurality of sub-pixels disposed within each of the plurality of unit areas. The cathode of at least one pixel of each of the plurality of unit areas may be a common cathode.

15 Claims, 13 Drawing Sheets

Related U.S. Application Data

(60) Provisional application No. 62/686,127, filed on Jun. 18, 2018.

(51) Int. Cl.
*H10K 71/00* (2023.01)
*H10K 71/13* (2023.01)
*H10K 77/10* (2023.01)
*H10K 102/00* (2023.01)

(52) U.S. Cl.
CPC ........ *H10K 77/111* (2023.02); *H10K 59/1201* (2023.02); *H10K 2102/311* (2023.02)

(58) Field of Classification Search
CPC .. H10K 59/1315; H10K 71/00; H10K 71/135; H10K 77/111; H10K 59/1201; H10K 2102/311; Y02E 10/549
See application file for complete search history.

(56) References Cited

U.S. PATENT DOCUMENTS

| | | |
|---|---|---|
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,111,357 A * | 8/2000 | Fleming ............... H10K 59/179 428/917 |
| 6,294,398 B1 | 9/2001 | Kim |
| 6,303,238 B1 | 10/2001 | Thompson |
| 6,337,102 B1 | 1/2002 | Forrest |
| 6,348,359 B1 | 2/2002 | Van Slyke |
| 6,468,819 B1 | 10/2002 | Kim |
| 6,537,688 B2 | 3/2003 | Silvernail |
| 6,597,111 B2 | 7/2003 | Silvernail |
| 6,664,137 B2 | 12/2003 | Weaver |
| 6,835,950 B2 | 12/2004 | Brown |
| 6,888,305 B2 | 5/2005 | Weaver |
| 6,888,307 B2 | 5/2005 | Silvernail |
| 6,897,474 B2 | 5/2005 | Brown |
| 7,187,119 B2 | 3/2007 | Weaver |
| 7,279,704 B2 | 10/2007 | Walters |
| 7,431,968 B1 | 10/2008 | Shtein |
| 7,633,218 B2 | 12/2009 | Cok |
| 7,683,534 B2 | 3/2010 | Weaver |
| 7,968,146 B2 | 6/2011 | Wagner |
| 9,318,544 B2 | 4/2016 | Chung |
| 2003/0230980 A1 | 12/2003 | Forrest |
| 2004/0174116 A1 | 9/2004 | Lu |
| 2006/0139275 A1 | 6/2006 | Yu |
| 2007/0138946 A1 * | 6/2007 | Cok ..................... H10K 50/856 313/504 |
| 2007/0159094 A1 | 7/2007 | Oh |
| 2009/0321752 A1 | 12/2009 | Zheng |
| 2014/0065750 A1 * | 3/2014 | Harikrishna Mohan ................. H10K 50/125 438/35 |
| 2015/0280170 A1 * | 10/2015 | Harikrishna Mohan ................. H10K 50/11 257/40 |
| 2016/0329388 A1 * | 11/2016 | Yokota ................ H10K 50/852 |
| 2017/0125488 A1 | 5/2017 | Kawato |
| 2017/0222170 A1 * | 8/2017 | Rothe ................ H10K 50/155 |
| 2017/0229663 A1 | 8/2017 | Tsai |
| 2018/0323404 A1 | 11/2018 | Inoue |
| 2018/0366730 A1 | 12/2018 | Dong |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

* cited by examiner

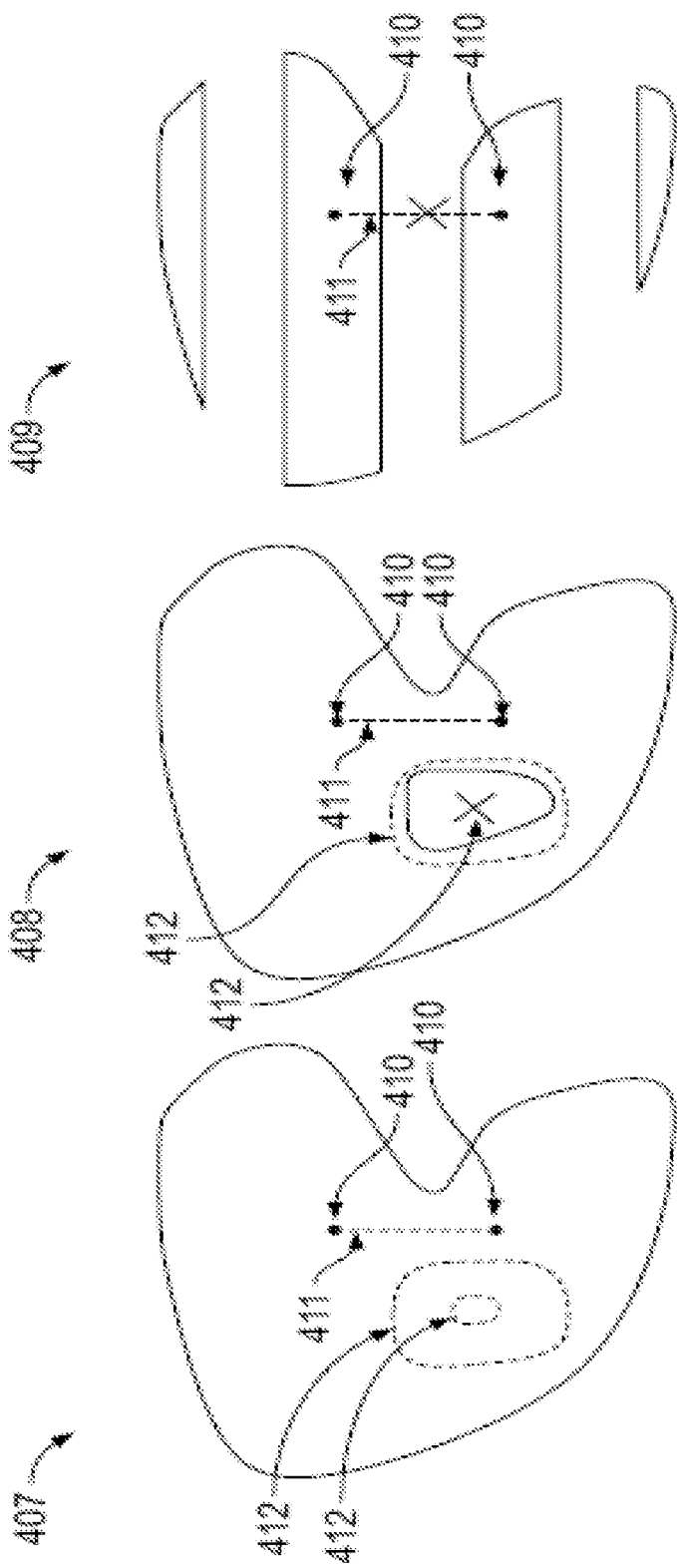

OLED DISPLAY WITH ALL ORGANIC THIN FILM LAYERS PATTERNED

CROSS-REFERENCE TO RELATED APPLICATIONS

This application is a continuation of U.S. patent application Ser. No. 16/431,813, filed Jun. 5, 2019, which claims priority to U.S. Patent Application Ser. No. 62/686,127, filed Jun. 18, 2018, the entire contents of each are incorporated herein by reference.

FIELD

The present invention relates to an organic light emitting diode (OLED) device having a repeating pattern of unit areas, where organic thin film covers portions of the of the device other than the unit areas. Layers of small molecule organic thin film are present between a substrate and thin film electrodes of the OLED device at other locations. The present invention also relates to a device having pixels with discontinuous organic layers disposed in a stack.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a device may include a substrate, and a plurality of unit areas of an OLED display disposed on the substrate. The unit areas may be repeating, area-filling subdivisions on the substrate that each have an anode and a cathode. The organic film may be disposed over portions of the device other than the unit areas. At least one pixel may have a plurality of sub-pixels disposed within each of the plurality of unit areas. The cathode of at least one pixel of each of the plurality of unit areas may be a common cathode.

Each cathode of the device may be addressed by a ground bus line through at least one via. The plurality of unit areas may include all points covered by the cathode that surrounds the at least one via. Each cathode encloses the at least one via, and the plurality of unit areas may exclude points close to other enclosed vias. An area between the cathode and substrate, located at the at least one via, may be free of the organic film.

The organic film of the device may be continuous or discontinuous. The continuous organic film is such that a path may be drawn between any two points on the substrate covered by the organic film without passing through a region that is not covered by the organic film.

The organic film of the device may be disposed on a simply connected region in which any curve within the region is shrinkable to a point without leaving the region. The organic film may be continuous and simply connected, the organic film may be continuous and not simply connected, or the organic film may be discontinuous.

The organic film may be disposed over portions of the device in lines. The organic film may be disposed over portions of the device in discrete segments. An area covered by the organic film may be less than an area of each of the plurality of unit areas. At least one of the plurality of unit areas of the device may be less than 0.10 mm². At least one of the plurality of unit areas of the device may be less than 0.04 mm².

According to an embodiment, an organic vapor jet printing (OVJP) method may include disposing a plurality of unit areas of an OLED display on a substrate, where the unit areas are repeating, area-filling subdivisions on the substrate that each have an anode and a cathode, and where the organic film is disposed over portions of the device other than the unit areas. The method may include disposing at least one pixel having a plurality of sub-pixels included within each of the plurality of unit areas, wherein the cathode of the at least one pixel of each of the plurality of unit areas may be a common cathode.

The method may include disposing a ground bus line through at least one via so as to address each cathode. The plurality of unit areas may be disposed so as to include all points covered by the cathode that surrounds the at least one via. Each cathode may be disposed so as to enclose the at least one via, and the plurality of unit areas may exclude points close to other enclosed vias. The method may include forming an area between the cathode and substrate, located at the at least one via, that is free of the organic film.

The disposed organic film may be continuous or discontinuous, and the continuous organic film is such that a path can be drawn between any two points on the substrate covered by the organic film without passing through a region that is not covered by the organic film. The organic film may be disposed on a simply connected region in which any curve within the region is shrinkable to a point without leaving the region. The organic film may be continuous and simply connected, the organic film may be continuous and not simply connected, or the organic film may be discontinuous.

The organic film may be disposed over portions of the device in lines. The organic film may be disposed over portions of the device in discrete segments. An area covered by the organic film may be less than an area of each of the plurality of unit areas. At least one of the plurality of unit areas may be less than 0.10 mm², or at least one of the plurality of unit areas may be less than 0.04 mm².

According to an embodiment, a method may include disposing an anode on a substrate, and forming at least one sub-pixel on the substrate using organic vapor jet printing (OVJP) by disposing a first type of non-emitting organic material disposed on an anode, disposing an emissive layer on the first type of non-emitting material, disposing a second type of non-emitting organic material following the disposition of the emissive layer, and disposing a cathode over the second type of non-emitting organic material. The first type of non-emitting organic material may be a p-type of non-emitting organic material, and the second type of non-emitting organic material is an n-type of non-emitting organic material.

The method may include forming a dielectric grid disposed adjacent to the anode on the substrate. The emissive layer to be disposed may be a red emissive layer, a green emissive layer, or a blue emissive layer. In some embodiments, other emissive layers may be included that may generate orange, yellow, white, blue-green, and/or violet light. A thin film stack of an OLED segment may include a single emissive layer, or may have a plurality of overlaid emissive layers. In some embodiments, a cavity thickness for other colors, such as yellow, may be fabricated in the same way. The at least one sub-pixel may be two sub-pixels, and the method may include disposing a bare region of the substrate between the two sub-pixels, and covering the bare region of the substrate by the cathode.

The method may include forming electrical contacts between the cathode and bus lines in the substrate using vias that correspond to holes and discontinuities in at least one of the first type of non-emitting organic material and the second type of non-emitting organic material. The cathode and the bus lines may be connected at a plurality of points.

At least the first type of non-emitting organic material, the emissive layer, and the second type of non-emitting organic material may be disposed using OVJP. At least the first type of non-emitting organic material, the emissive layer, and the second type of non-emitting organic material may be conformal to one another.

The method may include disposing a second emissive layer between the emissive layer and the second type of non-emitting organic material by OVJP. The method may include disposing a third non-emitting material between the first and second emissive layers by OVJP.

BRIEF DESCRIPTION OF THE DRAWINGS

FIG. 4B shows continuous, non-simply connected, and discontinuous regions of substrate unit areas according to embodiments of the disclosed subject matter.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
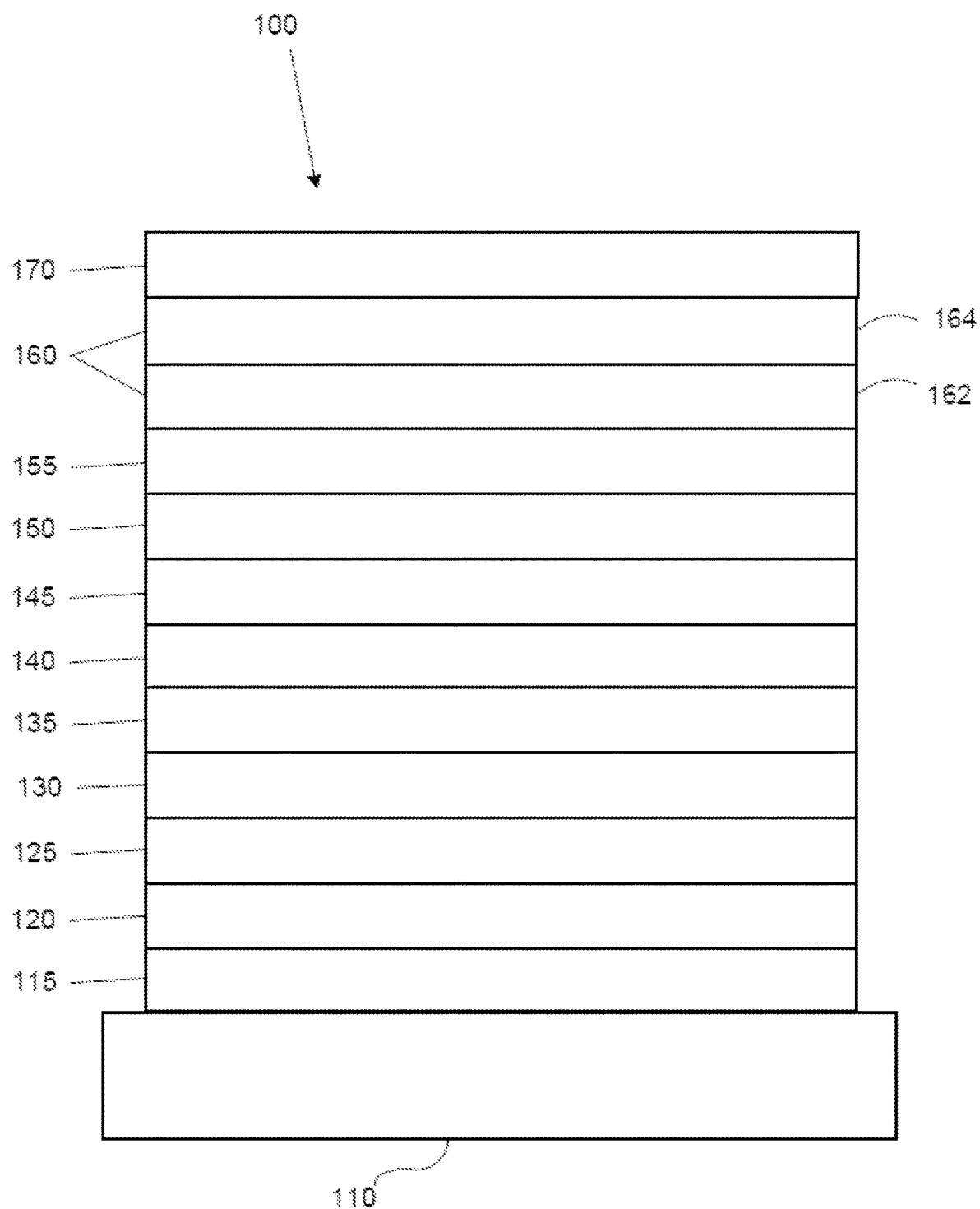
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
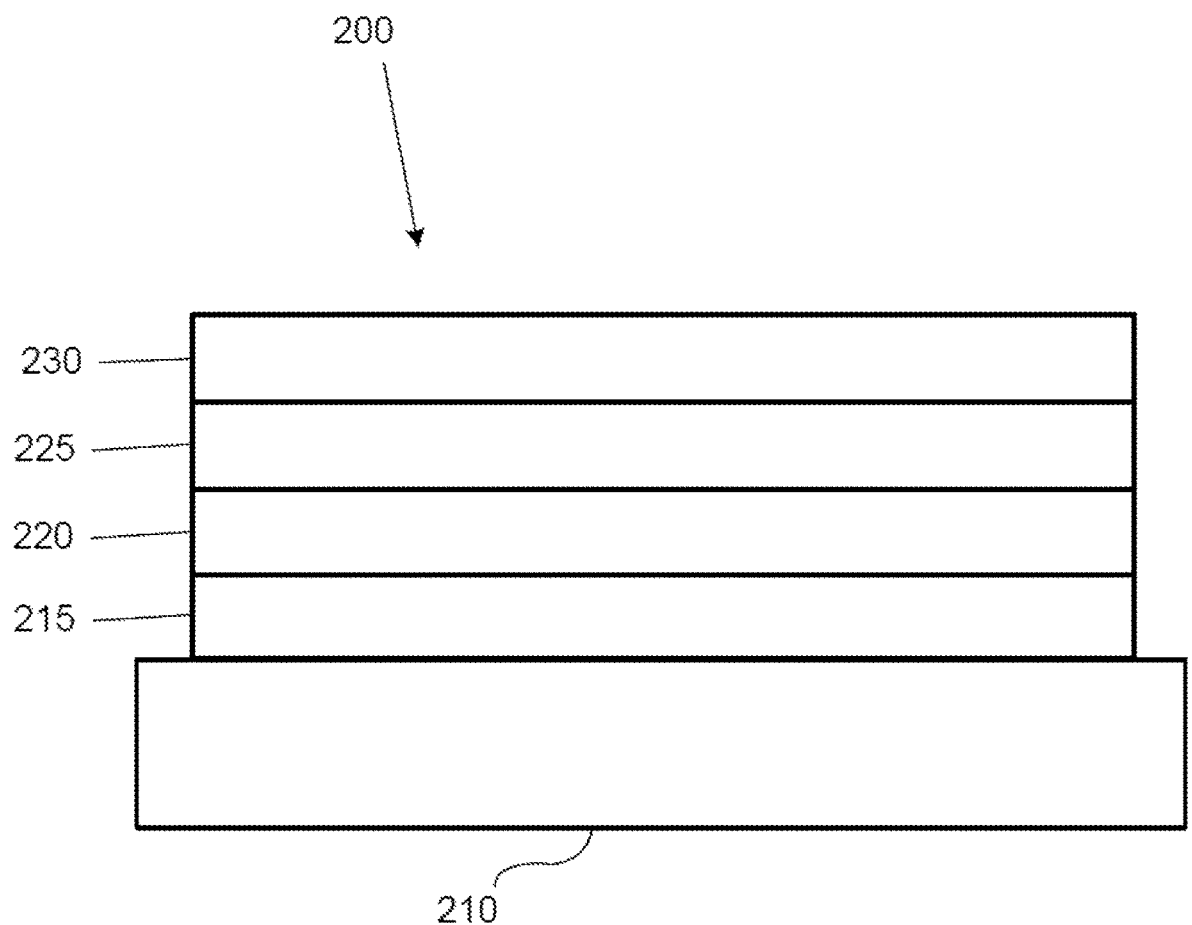
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL

A hole injecting/transporting material to be used in the present invention is not particularly limited, and any compound may be used as long as the compound is typically used as a hole injecting/transporting material.

EBL

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Figure 3A:
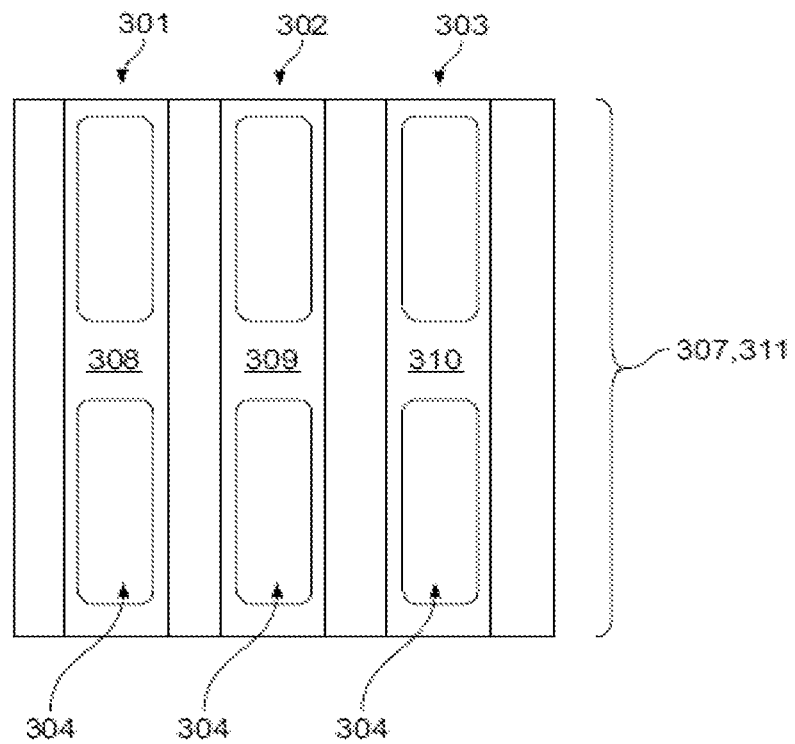
FIG. 3A shows a frontal section of a typical OLED pixel layout.
Figure 3B:
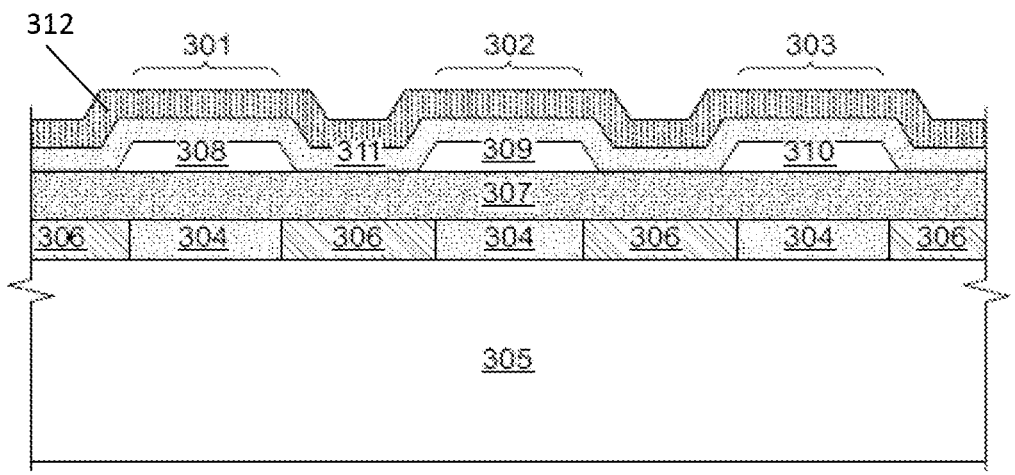
FIG. 3B shows a cross-section of a typical OLED pixel layout.

FIGS. 3A-3B show a typical pixel layout of an RGB (red, green, blue) OLED display, where FIG. 3A shows a frontal section and FIG. 3B shows a cross-section. Red 301, green 302, and blue 303 subpixels may be arranged side-by-side. The devices may have separate anodes 304 that may be each independently driven by a thin film transistor (TFT) backplane on a substrate 305. The anodes 304 may be separated by a dielectric grid or fence material 306 that may define the active areas of each device. The substrate 305 may have additional topographic features that are large relative to the thickness of the organic layers that form the red 301, green 302 and blue 303 sub-pixels, but these are omitted for clarity.

Layers of p-type organic semiconductors 307 may be deposited above the anodes 304. These layers do not emit light and may include hole injection, hole transport, and electron blocking layers with distinct compositions. One or more of these layers may be typically deposited as a blanket film that completely covers a field of pixels. Separate red 308, green 309, and blue 310 emissive layers may be deposited on top of previous layer over the anodes 304 for each color of pixel. These layers 308, 309, 310 may be patterned, and may either be deposited as segments or as continuous lines connecting the like-color subpixels of neighboring pixels (as shown). Layers of n-type organic semiconductors 311 may be deposited above the emissive layers 308, 309, 310 as a blanket film. These layers of n-type organic semiconductors 311 do not emit light and may include hole/exciton blocking, electron transport, and electron injection layers with distinct compositions. A thin metal cathode 312 may be deposited over the n-type layers of n-type organic semiconductors 311 as a blanket film.

Non-emissive organic layers may be deposited as blanket films because of the expense and complexity of patterning organic thin films with fine metal masks (FMM). Only layers that must be patterned to make a working device array are typically patterned. At least some non-emissive organic layers may be common to all devices in an array, so these layers are deposited as blanket films. The presence of blanket films between the active areas of the display may place limitations on the display structure. The organic thin films may act as insulators, preventing contact between the cathode and bus lines within the substrate. Low molecular weight organic thin films may typically have lower surface energies than other OLED components. This may lead to problems with electrode and encapsulation layer adhesion. Furthermore, organic layers that extend between devices may provide a pathway for defects to propagate.

Figure 3C:
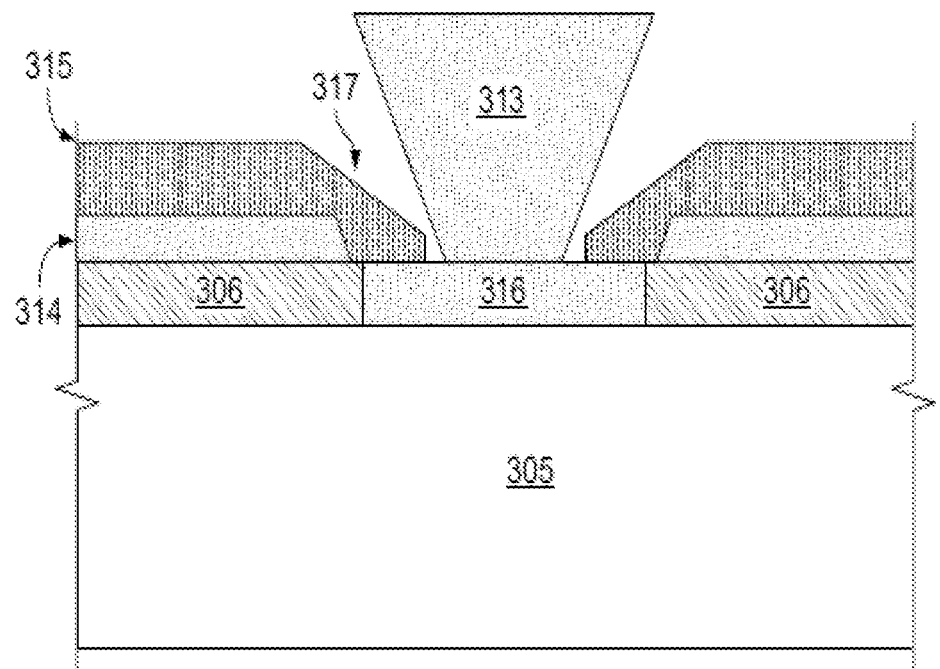
FIG. 3C shows a typical cathode to bus line via of an OLED pixel layout.

As shown in FIG. 3C, vias between a cathode and a ground bus lines in the substrate may be made using undercut pillars of dielectric material 313 to mask organic deposition 314 over a bus line. Cathode metal 315 may be deposited onto the substrate at an incident angle that permits coverage of both the OLED active areas and regions of the bus line 316 masked by the pillar. Contact may be made at a via 317 where the cathode metal touches regions of bare bus line that are masked from organic deposition by the pillar. Examples of this approach are disclosed in U.S. Pat. Nos. 6,348,359 and 7,633,218. The barrier based approach has several drawbacks. Firstly, organic material must be well collimated to be effectively masked by on-substrate pillars, so that the incident beam is blocked and/or there is a large separation between the source and substrate. Utilization efficiency is reduced in either case. Secondly, thick film dielectric barriers may promote light scattering and reduce the contrast and resolution of the display. Thirdly, the varied surface topography and shadowed regions created by barriers complicates thin film encapsulation.

An alternate approach disclosed in U.S. Pat. No. 9,318,544 deposits both a "deposition mold" and shadow masks to define a cathode. The cathode patterns extend across many pixels, but may be split so that different color subpixels are addressed by different voltages. The cathode pattern is generally coarser than the pixel pattern but still requires a fine metal mask.

Embodiments of the disclosed subject matter provide a display or lighting architecture in which each unit area of an OLED display contains regions that may not be covered by any small molecule organic thin film. A unit area of a substrate may be a repeating, area filling subdivision on the substrate. For example, the unit area may be a pixel if that is the largest unit on the substrate. The unit area may be defined as including all points covered by a continuous cathode surrounding a via. If a cathode encloses multiple vias, the unit area excludes those points closer to other enclosed vias. Note that a unit area may contain multiple cathode traces.

Figure 4A:
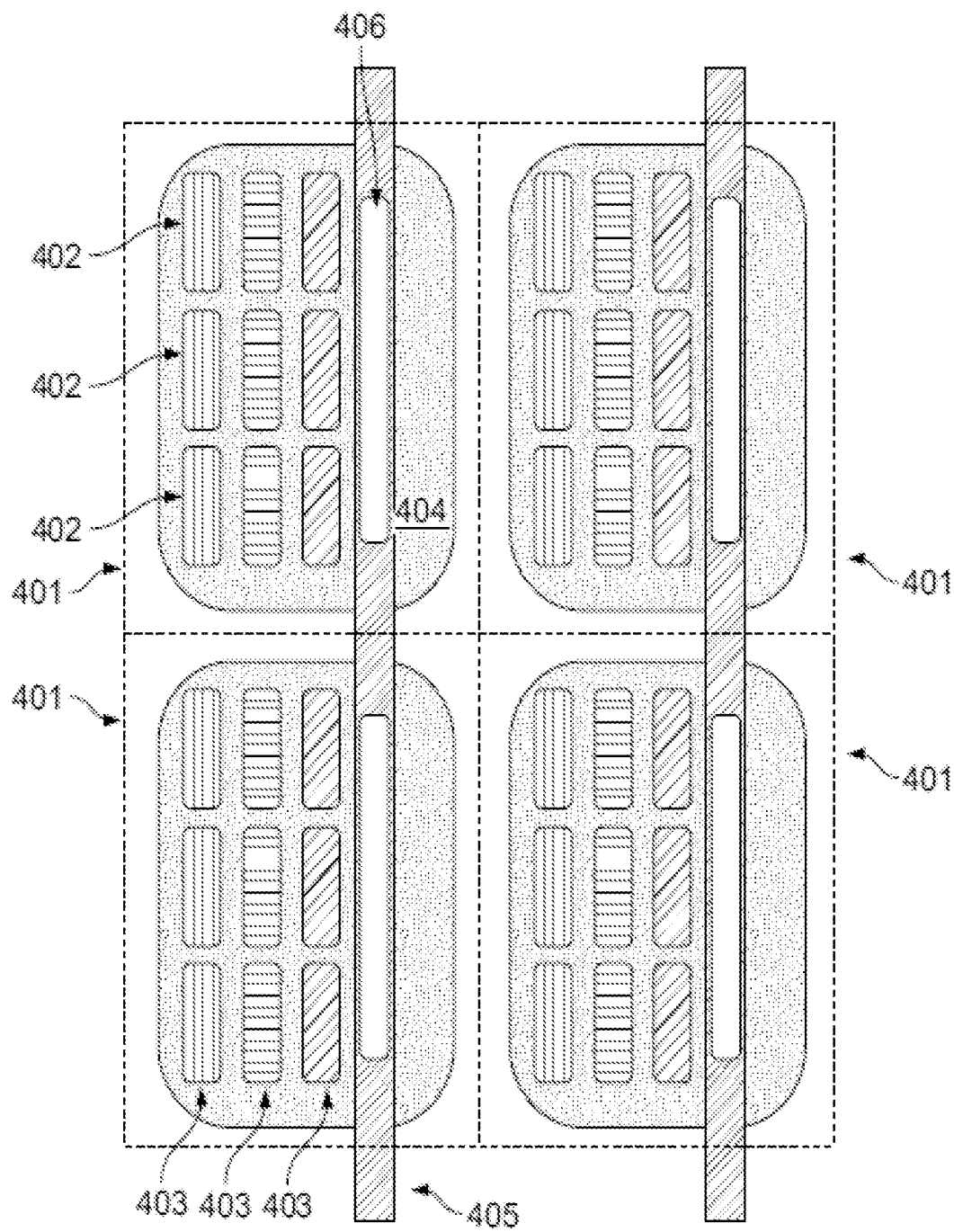
FIG. 4A shows an example substrate unit area according to an embodiment of the disclosed subject matter.

An example of an array of unit areas of the embodiments of the disclosed invention is shown in FIG. 4A. Four unit areas 401 are shown, each containing three pixels 402 of three subpixels 403. A common cathode 404 may by included in the three pixels 402 of each unit area. The common cathode 404 may be addressed by a ground bus line 405 through a via 406. No organic material may be disposed between the common cathode 404 and substrate at the via 406. The disclosed device structure may have no thin film discontinuities in the organic thin film created by topographic structures on the substrate, distinguishing it from related art structures. The shape of the organic thin film layer may be defined by an additive patterning process such as organic vapor jet printing or inkjet printing. Organic thin film may be used with small molecule organic thin film, as discussed in detail below.

The organic thin film within the unit area may be continuous or discontinuous. A continuous organic thin film layer may be such that a path can be drawn between any two points on a substrate covered by that layer without passing through a region that is not covered by organic thin film. The thin film layer may be a simply connected region that is one in which any curve within the region may be shrunk to a point without leaving the region. In two dimensions, this means that an area containing holes is not simply connected. FIG. 4B shows examples of regions that are both continuous and simply connected 407, continuous but not simply connected 408, and discontinuous 409. Examples of points 410, paths 411, and curves 412 are given to illustrate the above definitions.

Figure 5A:
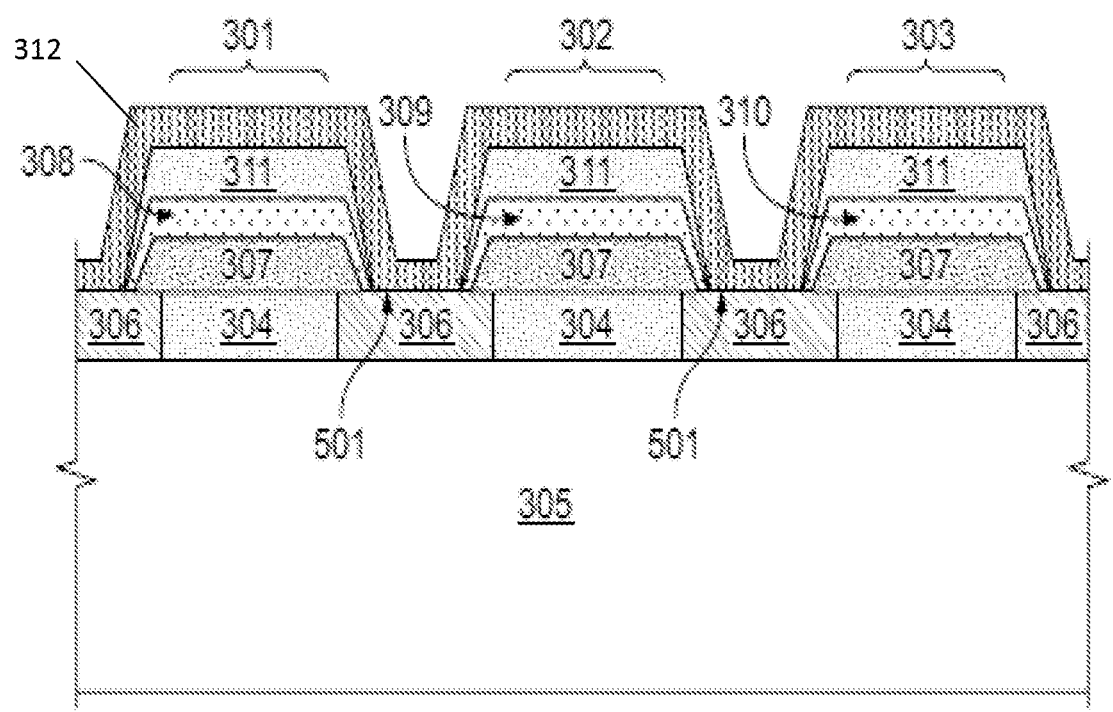
FIGS. 5A-5B show cross-sections of OLED pixel layouts made from discontinuous organic layers according to embodiments of the disclosed subject matter.

One embodiment of an OLED of the disclosed subject matter with no continuous organic layers within a unit area is shown in cross section in FIG. 5A. The p-type and n-type non-emissive layers of each active area may be patterned and separated from each other in the same way as the active layers. This leaves bare regions 501 of the substrate that are wetted by the cathode. This configuration may have advantages over blanket organic layer deposition. The substrate and cathode may form pockets that completely enclose the organic layers, protecting them during processing until a dedicated encapsulation layer is applied. The cathode may adhere more strongly to the bare substrate than the organic thin film layer, so these regions may facilitate encapsulation by providing stress relief that anchor the encapsulation layer to the substrate. This may reduce the mechanical stress on devices in flexible and foldable applications. Placing the organic material in separate pockets may minimize and/or prevent defects from propagating between pockets. Discontinuous organic layers may make encapsulation more robust, enabling longer device lifetimes.

Figure 5B:
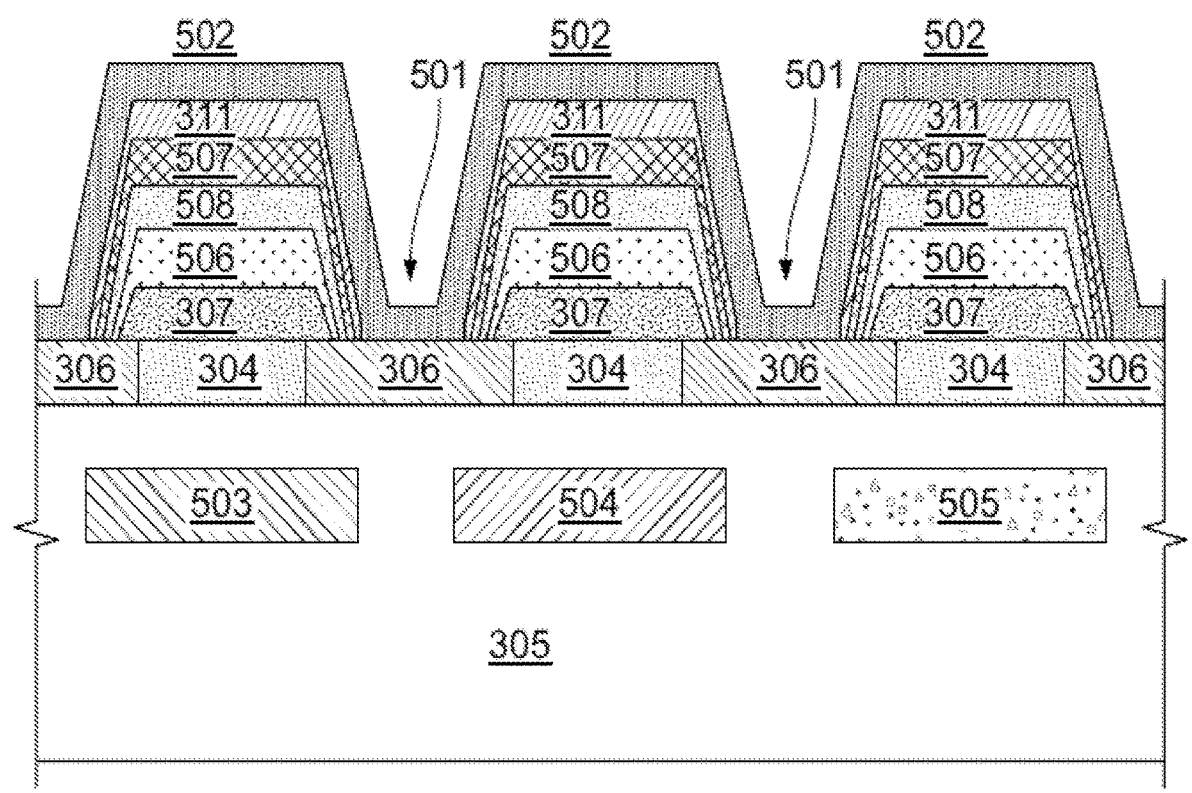

An alternate configuration for a pixel with discontinuous organic layers is shown in FIG. 5B. A plurality of white light emitting segments 502 may be aligned with an array of red 503, green 504, and blue 505 color filters so that a single color is transmitted through the substrate 305 from each of the pixels. Each subpixel may include a yellow emissive layer 506 and a blue emissive layer 507 disposed in a stack. One or more interlayers 508 may be present between the emissive layers 506, 507 of the stack. Combinations of organic layers may be generated if each layer is printed by OVJP. A combination of printed layers may be either particular to each color of subpixel, or it may be common to all subpixels as shown.

Figure 6A:
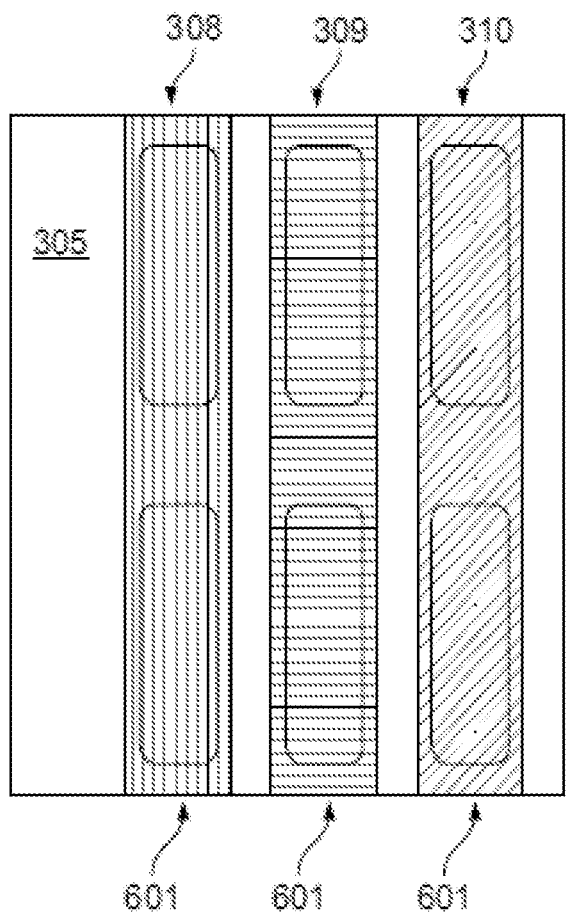
FIG. 6A shows a frontal section of an OLED pixel layout in which organic material is deposited as lines according to an embodiment of the disclosed subject matter.
Figure 6B:
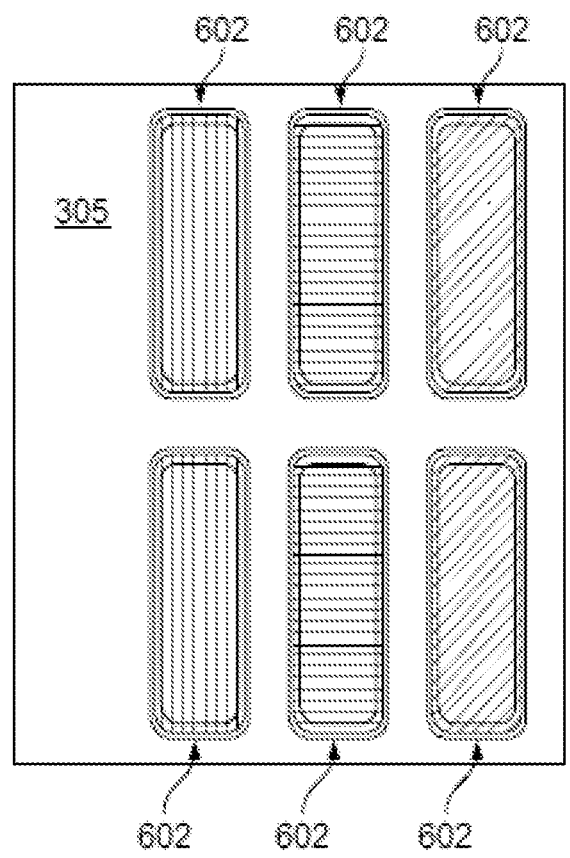
FIG. 6B shows a frontal section of an OLED pixel layout in which organic material is deposited as discrete segments according to an embodiment of the disclosed subject matter.

Embodiments of the disclosed subject matter provide discontinuous non-emissive layer patterns that may include lines 601, as shown in FIG. 6A, and discrete segments 602, as shown in FIG. 6B. Lines may be easier to fabricate, since they are compatible with DEC (Depositor-Exhaust-Confinement) OVJP. Devices in each line may be connected by common organic layers, but the spaces between them are discontinuous. A fully segmented pattern may be more difficult to fabricate, but it may have the advantage of providing more complete chemical and mechanical isolation of each device in the array.

Figure 7:
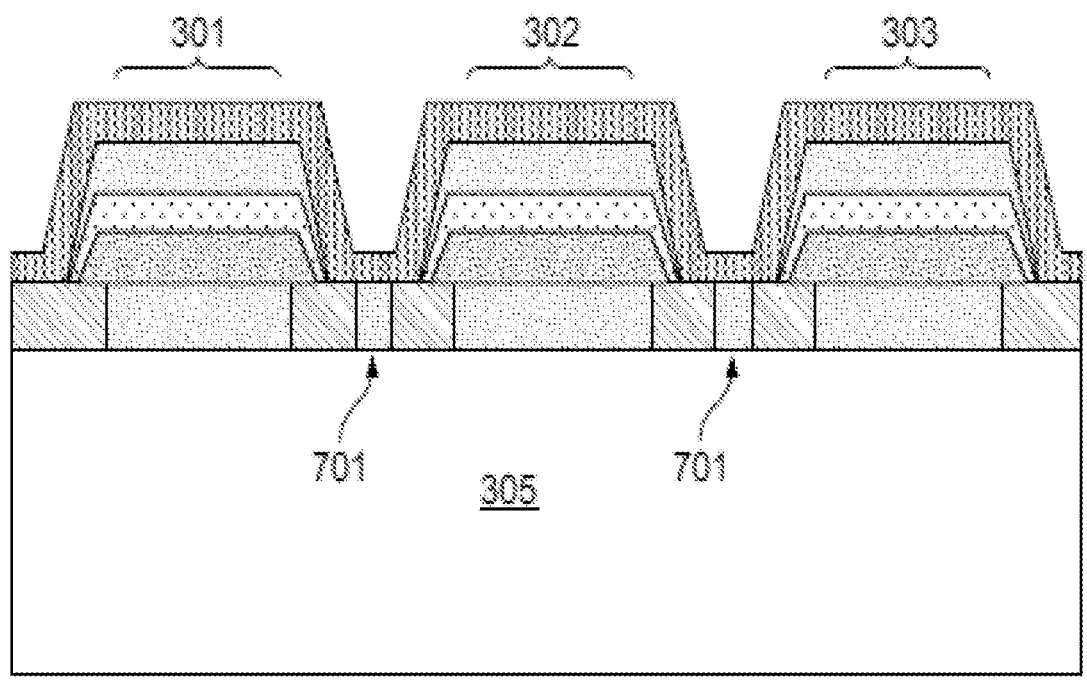
FIG. 7 shows a cross-section of an embodiment of an OLED pixel that contains a via connecting a cathode and substrate according to an embodiment of the disclosed subject matter.

FIG. 7 shows a cross-section of an embodiment of an OLED pixel that contains a via connecting the cathode and substrate according to an embodiment of the disclosed subject matter. Holes and discontinuities in the organic layer may correspond to vias 701 that form electrical contacts between the cathode and bus lines in the substrate. The absence of organic material over each via may permit a low resistance contact to be formed between the cathode and substrate. Transparent electrodes usually have poor conductivity, while bus lines in an opaque substrate may be very conductive. Connecting the cathodes to bus lines at many points may decrease resistive losses within the cathode layer. This, in turn, reduces mura and brightness non-uniformity in the display, since devices located far from the via of a resistive cathode receive less current than closer ones. Finally, a thinner cathode layer may be used to achieve given brightness and uniformity specifications if the vias are more closely spaced, permitting less optical absorption and improved outcoupling.

Figure 8A:
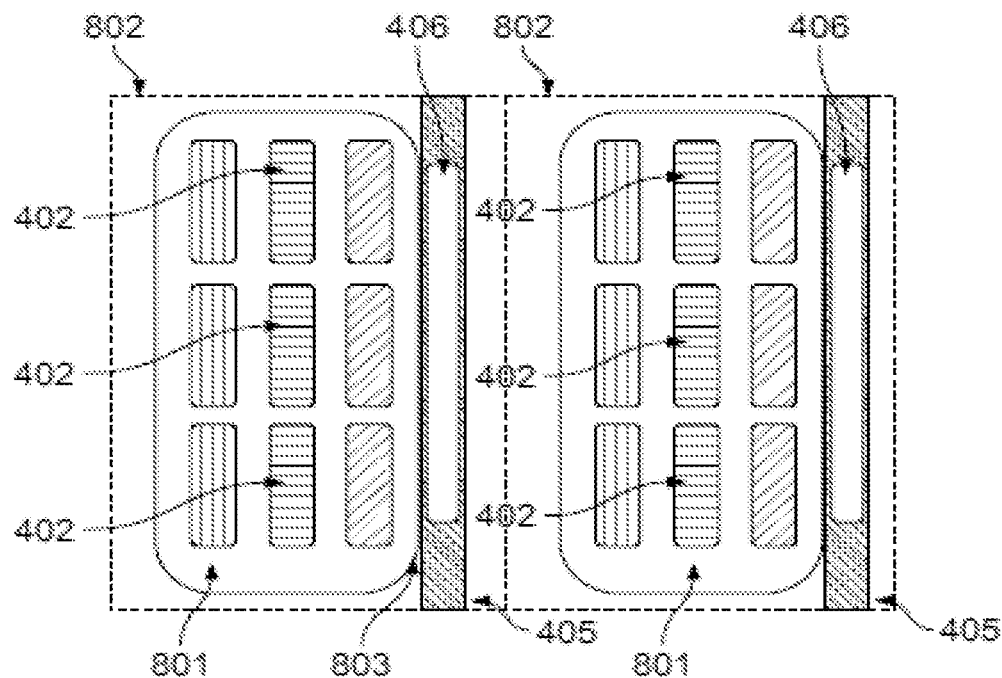
FIG. 8A shows a simply connected organic layer that extends across several pixels, but terminates to avoid a via to a ground bus line according to an embodiment of the disclosed subject matter.
Figure 8B:
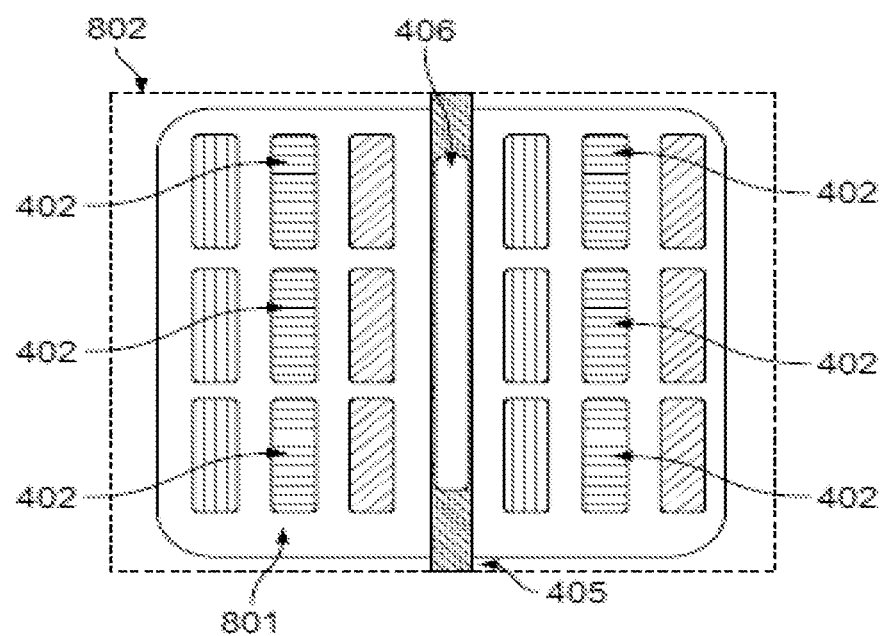
FIG. 8B shows an organic layer is continuous across a unit area, which has two rows of pixels, but it is not simply connected because the layer has a hole in it corresponding to the via according to an embodiment of the disclosed subject matter.

FIGS. 8A-8B show embodiments of the disclosed subject matter that may not require a display be made from discontinuous organic layers, so long as the area covered by organic layers 801 is less than that of the unit area (surrounded by dashed box) 802. The organic thin film covered region may be either simply connected, as shown in FIG. 8A, or it may not be, as shown in FIG. 8B. In FIG. 8A, an organic layer may extend across several pixels, but terminates 803 to avoid a via to the ground bus line, so as not to block it when the cathode is deposited. Although the area of the organic thin film may be less than that of the unit area, there are no breaks or holes in it, so it is both continuous and simply connected. Each row of pixels has a bus line associated with it. This contrasts with the embodiment shown in FIG. 8B, in which each bus line serves two rows of pixels, one on each side of it. The organic layer may be continuous across the unit area, which may include the two rows of pixels, but it is not simply connected because the layer has a hole in it corresponding to the via. Vias may be associated with every pixel, every row of pixels or at intervals within groups of the same. Individual subpixels may be connected by an organic thin film, so they are not as well chemically and mechanically isolated as in the embodiments shown in FIGS. 5-7. The presence of clear, flat vias may however, still facilitate the adhesion of cathode and encapsulant layers. The organic layers may have additional breaks between pixels, or they may extend between groupings of pixels, as depicted.

Figure 10:
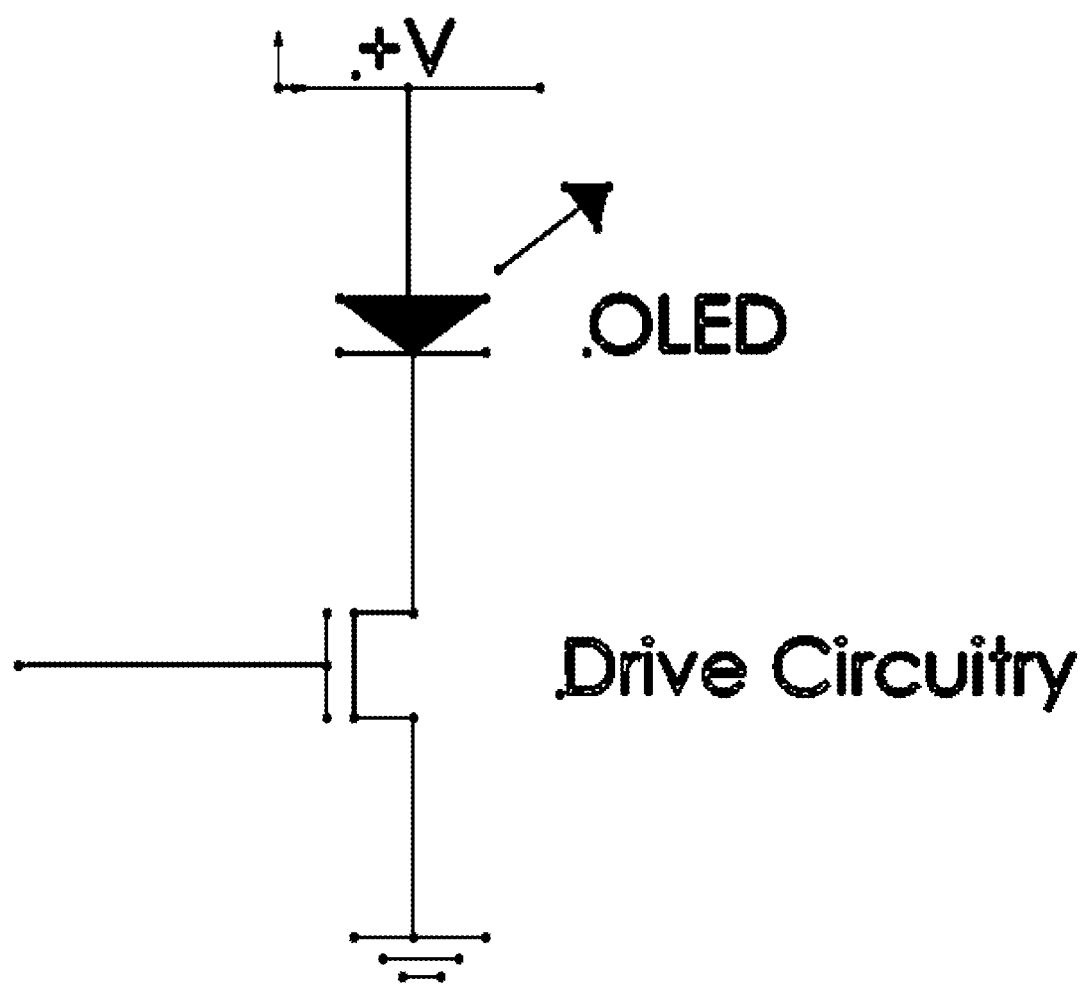
FIG. 10 shows a drive circuit of a thin film transistor back plane that may be used according to an embodiment of the disclosed subject matter.

The disclosed patterning technique makes it possible to directly connect the cathode of each subpixel with the backplane. The segments of cathode may be electrically isolated from each other. FIG. 10 shows that the OLED structure disclosed above may be driven by a thin film transistor (TFT) backplane in which the transistors regulating current 1001 are positioned between the OLED 1002 and cathode at ground 1003, while the OLED is connected directly to the anode 1004. Related art backplanes generally have an OLED connected directly to the cathode, and the transistors regulating the current through it are between it and the anode.

Figure 9A:
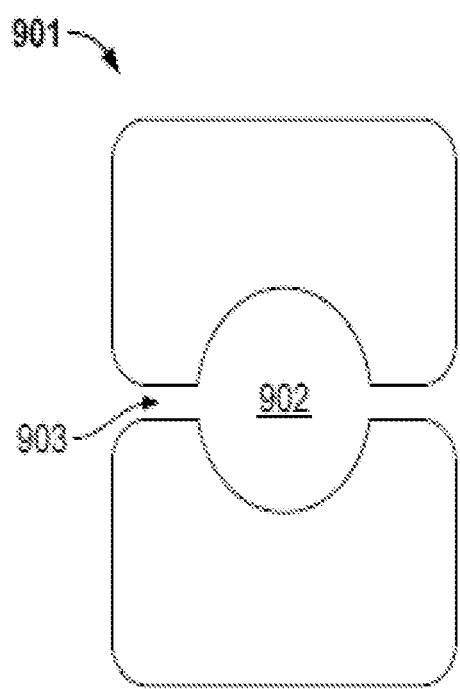
FIG. 9A shows an annular feature made with a shadow mask according to an embodiment of the disclosed subject matter.
Figure 9B:
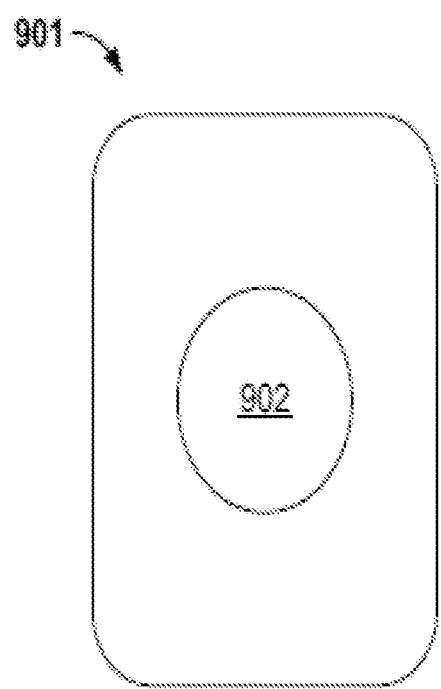
FIG. 9B shows an annual features deposited through a printing technique according to an embodiment of the disclosed subject matter.

Thin metal masks do not permit the deposition of an organic thin film with isolated holes. As shown in FIG. 9A, runners may be formed between the mask edge defining the perimeter of the feature 901 and the area of the mask blocking deposition onto an interior region 902. These runners cast a shadow 903 that connects the perimeter of a deposited feature with its center. It is therefore difficult to create a freestanding hole in, or any non-simply connected shape from, an organic thin film using shadow masks. If organic material is deposited by a direct printing method, however, thin films with freestanding holes may be deposited, as shown in FIG. 9B. Organic vapor jet printing may therefore be uniquely suited to deposit and pattern the non-emissive layers of OLED structures containing cathode to substrate vias. Organic vapor jet printing may permit the deposition of organic layers of arbitrary shape without need of ancillary patterning features on the substrate. This may permit the deletion of grid or banking structures from the substrate.

The embodiments of the disclosed subject matter discussed above assume a top emission, non-inverted OLED structure in which the anode is on the substrate and the cathode is a deposited thin film. The foregoing description may apply to an inverted OLED structure if the terms cathode and anode are switched so that the deposited electrode over top of the organic thin film acts as an anode. The charge carrier types of the upper and lower components of the organic thin film stack are reversed as well.

As shown in FIGS. 4A-9B and described above, a device of the disclosed subject matter may include a substrate (e.g., substrate 305 shown in FIG. 5A), and a plurality of unit areas (e.g., unit areas 401 shown in FIG. 4A; unit area 802 shown in FIG. 8) of an OLED display disposed on the substrate. The unit areas may be repeating, area-filling subdivisions on the substrate that each have an anode (e.g., anode 304 shown in FIG. 5A) and a cathode (e.g., common cathode 404 shown in FIG. 4A). The organic film may be disposed over portions of the device other than the unit areas. At least one pixel may have a plurality of sub-pixels (e.g., pixels 402 shown in FIG. 4A; subpixels 301, 302, 303 shown in FIG. 5A) disposed within each of the plurality of unit areas (e.g., unit areas 401 shown in FIG. 4A). The cathode of the at least one pixel (e.g., pixels 402 shown in FIG. 4A) of each of the plurality of unit areas may include a common cathode.

Each cathode of the device may be addressed by a ground bus line (e.g., ground bus line 405 shown in FIGS. 4, 8A, and 8B) through at least one via (e.g., via 406 shown in FIGS. 4A, 8A, and 8B; via 701 shown in FIG. 7). The plurality of unit areas may include all points (e.g., points 410 shown in FIG. 4B) of the common cathode that surrounds the at least one via. Each cathode (e.g., common cathode 404 shown in FIG. 4A) encloses the at least one via (e.g., via 406 shown in FIG. 4A), and the plurality of unit areas may exclude points close to other enclosed vias. An area between the common cathode and substrate, located at the at least one via, that may be free of the organic film (e.g., base region of substrate 501 shown in FIG. 5A).

The organic film of the device may be continuous (e.g., regions 407, 408 shown in FIG. 4B) or discontinuous (e.g., region 409 shown in FIG. 4B). The continuous organic film is such that a path (e.g., paths 411 shown in FIG. 4B) may be drawn between any two points (e.g., points 410 shown in FIG. 4B) on the substrate covered by the organic film without passing through a region that is not covered by the organic film.

The organic film of the device may be disposed on a simply connected region (e.g., region 407 shown in FIG. 4B) in which any curve (e.g., curves 412 shown in FIG. 4B) within the region is shrinkable to a point without leaving the region. The organic film may be continuous and simply connected (e.g., region 407 shown in FIG. 4B), the organic film may be continuous and not simply connected (e.g., region 408 shown in FIG. 4B), or the organic film may be discontinuous (e.g., region 409 shown in FIG. 4B).

The organic film may be disposed over portions of the device in lines (e.g., lines 601 shown in FIG. 6A). The organic film may be disposed over portions of the device in discrete segments (e.g., discrete segments 602 shown in FIG. 6B). An area covered by the organic film may be less than an area of each of the plurality of unit areas. At least one of the plurality of unit areas of the device may be less than 0.10 mm$^2$. At least one of the plurality of unit areas of the device may be less than 0.04 mm$^2$.

An OVJP method according to the disclosed subject matter may include disposing a plurality of unit areas of an OLED display on a substrate (e.g., substrate 305 shown in FIG. 5A), where the unit areas (e.g., unit areas 401 shown in FIG. 4A; unit area 802 shown in FIG. 8) are repeating, area-filling subdivisions on the substrate that each have an anode (e.g., anode 304 shown in FIG. 5A) and a cathode (e.g., cathode 404 shown in FIG. 4A), and where the organic film is disposed over portions of the device other than the unit areas. The method may include disposing at least one pixel having a plurality of sub-pixels (e.g., pixels 402 shown in FIG. 4A; subpixels 301, 302, 303 shown in FIG. 5A) included within each of the plurality of unit areas (e.g., unit areas 401 shown in FIG. 4A), and the at least one pixel (e.g., pixels 402 shown in FIG. 4A) of each of the plurality of unit areas includes the common cathode.

The method may include disposing a ground bus line (e.g., ground bus line 405 shown in FIGS. 4, 8A, and 8B) through at least one via (e.g., via 406 shown in FIGS. 4A, 8A, and 8B; via 701 shown in FIG. 7) so as to address each cathode. The plurality of unit areas may be disposed so as to include all points (e.g., points 410 shown in FIG. 4B) of the common cathode that surrounds the at least one via. Each cathode (e.g., common cathode 404 shown in FIG. 4A) may be disposed so as to enclose the at least one via (e.g., via 406 shown in FIG. 4A), and the plurality of unit areas may exclude points close to other enclosed vias. The method may include forming an area between the common cathode and substrate, located at the at least one via, that is free of the organic film (e.g., base region of substrate 501 shown in FIG. 5A).

The disposed organic film may be continuous (e.g., regions 407, 408 shown in FIG. 4B) or discontinuous (e.g., region 409 shown in FIG. 4B), and the continuous organic film is such that a path (e.g., paths 411 shown in FIG. 4B) can be drawn between any two points (e.g., points 410 shown in FIG. 4B) on the substrate covered by the organic film without passing through a region that is not covered by the organic film. The organic film may be disposed on a simply connected region (e.g., region 407 shown in FIG. 4B) in which any curve (e.g., curves 412 shown in FIG. 4B) within the region is shrinkable to a point without leaving the region. The organic film may be continuous and simply connected (e.g., region 407 shown in FIG. 4B), the organic film may be continuous and not simply connected (e.g., region 408 shown in FIG. 4B), or the organic film may be discontinuous (e.g., region 409 shown in FIG. 4B).

The organic film may be disposed over portions of the device in lines (e.g., lines 601 shown in FIG. 6A). The organic film may be disposed over portions of the device in discrete segments (e.g., discrete segments 602 shown in FIG. 6B). An area covered by the organic film may be less than an area of each of the plurality of unit areas. At least one of the plurality of unit areas may be less than 0.10 mm$^2$, or at least one of the plurality of unit areas may be less than 0.04 mm$^2$.

A method of the disclosed subject matter may include forming at least one sub-pixel (e.g., pixels 402 shown in FIG. 4A; subpixels 301, 302, 303 shown in FIG. 5A) on a substrate using OVJP by disposing an anode (e.g., anode 304 shown in FIG. 5A) on the substrate (e.g., substrate 305 shown in FIG. 5A), disposing a first type of non-emitting organic material (e.g., p-type organic semiconductor 307 shown in FIG. 5A) disposed on the anode (e.g., anode 304 shown in FIG. 5A), disposing an emissive layer (e.g., emissive layer 308, 309, 310 shown in FIG. 5A) on the first type of non-emitting material, disposing a second type of non-emitting organic material (e.g., n-type organic semiconductor material 311) on the emissive layer, and disposing a cathode (e.g., cathode 404 shown in FIG. 4A) over the second type of non-emitting organic material. The first type of non-emitting organic material may be a p-type of non-emitting organic material (e.g., p-type organic semiconductor 307 shown in FIG. 5A), and the second type of non-emitting organic material is an n-type of non-emitting organic material (e.g., n-type organic semiconductor material 311).

The method may include forming a dielectric grid (e.g., dielectric grid 306 shown in FIG. 5A) disposed adjacent to the anode (e.g., anode 304 shown in FIG. 5A) on the substrate (e.g., substrate 305 shown in FIG. 5A). The emissive layer (e.g., emissive layer 308, 309, 310 shown in FIG. 5A) to be disposed may be a red emissive layer (e.g., red emissive layer 308 shown in FIG. 5A), a green emissive layer (e.g., green emissive layer 309 shown in FIG. 5A), or a blue emissive layer (e.g., blue emissive layer 310 shown in FIG. 5A). In some embodiments, a display may have subpixels that include emissive layers that generate orange, yellow, white, blue-green, and/or violet light, and/or any other suitable color of light. Subpixels may also include a plurality of emissive layers disposed in a stack to produce polychromatic emission. Non-emissive layers may be dispersed between emissive layers in the stack. The at least one sub-pixel may be two sub-pixels (e.g., subpixels 301, 302, 303 shown in FIG. 5A), and the method may include disposing a bare region (e.g., region 306 shown in FIG. 5A) of the substrate between the two sub-pixels, and covering the bare region of the substrate by the cathode.

The method may include forming electrical contacts between the cathode and bus lines (e.g., ground bus line 405 shown in FIGS. 8A-8B) in the substrate using vias (e.g., via 701 shown in FIG. 7; via 406 shown in FIGS. 8A-8B) that correspond to holes and discontinuities in at least one of the first type of non-emitting organic material (e.g., p-type organic semiconductor 307 shown in FIG. 5A) and the second type of non-emitting organic material (e.g., n-type organic semiconductor material 311). The cathode and the bus lines may be connected at a plurality of points.

At least the first type of non-emitting organic material (e.g., p-type organic semiconductor 307 shown in FIG. 5A), the emissive layer (e.g., emissive layer 308, 309, 310 shown in FIG. 5A), and the second type of non-emitting organic material (e.g., n-type organic semiconductor material 311) may be disposed using OVJP. At least the first type of non-emitting organic material, the emissive layer, and the second type of non-emitting organic material may be conformal to one another.

A second emissive layer (e.g., emissive layer 507 show in FIG. 5B) may be disposed between the emissive layer (e.g., emissive layer 506 in FIG. 5B) and the second type of non-emitting organic material (e.g., n-type organic semiconductor material 311) by OVJP. The method may include disposing a third non-emitting material (e.g., interlayer 508) between the emissive layer (e.g., emissive layer 506) and second emissive layer (e.g., emissive layer 507) by OVJP.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
   a substrate;
   at least two lines disposed on the substrate, wherein each of the at least two lines includes a segmented emissive layer and at least one continuous organic semiconductor layer for a plurality of pixels creating the corresponding line, wherein
   each segment of the segmented emissive layer is provided in a respective pixel of the corresponding line, and wherein
   the segmented emissive layer of one of the at least two lines is separated from the segmented emissive layer of another of the at least two lines.

2. The device of claim 1, wherein each of the at least two lines includes an anode and a cathode.

3. The device of claim 2, wherein the cathode is addressed by a ground bus line through at least one via.

4. The device of claim 2, wherein the cathode encloses at least one via.

5. The device of claim 2, wherein an area between the cathode and substrate that includes at least one via is free of at least the emissive layer.

6. The device of claim 1, wherein an emissive layer of one of the at least two lines emits a light different from a light of another one of the at least two lines.

7. The device of claim 1, wherein the at least two lines disposed on the substrate comprise a first line, a second line, and a third line,
   wherein the first line includes a red emissive layer, the second line includes a green emissive layer, and the third line includes a blue emissive layer.

8. The device of claim 1, wherein the emissive layer of at least one of lines comprises at least one selected from a group consisting of: a single emissive layer, and a plurality of overlaid emissive layers.

9. The device of claim 1, further comprising at least a second emissive layer disposed over the emissive layer of at least one of lines in a stack.

10. The device of claim 9, wherein the emissive layer and the second emissive layer comprise at least one selected from the group consisting of: different colors of emissive layers, and emissive layers of the same color.

11. The device of claim 9, wherein the stack comprises one or more interlayers disposed between the emissive layer and the second emissive layer of the stack.

12. The device of claim 11, wherein the emissive layer, the second emissive layer, and the one or more interlayers comprise at least one selected from the group consisting of: different colors of emissive layers, and emissive layers of the same color.

13. The device of claim 1, wherein at least a second emissive layer is included to at least one of the lines, wherein the second emissive layer comprises at least one selected from the group consisting of: an orange emissive layer, a yellow emissive layer, a white emissive layer, a blue-green emissive layer, and a violet emissive layer.

14. The device of claim 1, wherein at least one of the plurality of sub-pixels comprises a plurality of emissive layers disposed in a stack.

15. The device of claim 14, wherein the stack has polychromatic emission.

* * * * *